(12) United States Patent
Kolandaivelu et al.

(10) Patent No.: US 10,338,173 B2
(45) Date of Patent: Jul. 2, 2019

(54) DEVICE FOR CANCELLATION OF LARGE MAGNETIC SUSCEPTIBILITY ARTIFACTS IN MAGNETIC RESONANCE IMAGING OF PATIENTS WITH PACEMAKERS AND IMPLANTABLE CARDIAC DEFIBRILLATORS

(71) Applicant: THE JOHNS HOPKINS UNIVERSITY, Baltimore, MD (US)

(72) Inventors: Aravindan Kolandaivelu, Baltimore, MD (US); Henry Halperin, Baltimore, MD (US)

(73) Assignee: The Johns Hopkins University, Baltimore, MD (US)

( * ) Notice: Subject to any disclaimer, the term of this patent is extended or adjusted under 35 U.S.C. 154(b) by 837 days.

(21) Appl. No.: 14/892,390

(22) PCT Filed: May 22, 2014

(86) PCT No.: PCT/US2014/039068
§ 371 (c)(1),
(2) Date: Nov. 19, 2015

(87) PCT Pub. No.: WO2014/190115
PCT Pub. Date: Nov. 27, 2014

(65) Prior Publication Data
US 2016/0091581 A1 Mar. 31, 2016

Related U.S. Application Data

(60) Provisional application No. 61/826,194, filed on May 22, 2013.

(51) Int. Cl.
G01V 3/00 (2006.01)
G01R 33/3875 (2006.01)
G01R 33/565 (2006.01)

(52) U.S. Cl.
CPC ... *G01R 33/3875* (2013.01); *G01R 33/56536* (2013.01)

(58) Field of Classification Search
CPC ..... A61B 5/055; A61B 5/0555; A61B 5/7278; A61B 5/725; G01R 33/34;
(Continued)

(56) References Cited

U.S. PATENT DOCUMENTS

| | | | |
|---|---|---|---|
| 2001/0048306 A1* | 12/2001 | Mueller | G01R 33/3875 324/334 |
| 2002/0101237 A1* | 8/2002 | Miyosi | G01R 33/56518 324/307 |
| 2004/0066194 A1 | 4/2004 | Slade et al. | |
| 2008/0129298 A1* | 6/2008 | Vaughan | G01R 33/5612 324/322 |

(Continued)

FOREIGN PATENT DOCUMENTS

KR 10-2005-0064513 A 6/2005

*Primary Examiner* — Thang X Le
(74) *Attorney, Agent, or Firm* — Harrity & Harrity, LLP

(57) ABSTRACT

The present invention is directed to a system and method for reducing large magnetic artifact susceptibility in magnetic resonance imaging. The present invention is used to maximize cancellation of the magnetic field distortion cremated when objects with high variations in magnetic susceptibility are placed in a uniform magnetic field. Particularly, the present invention reduces the magnetic resonance imaging artifact produced by pacemakers and internal cardiac defibrillators in order to maximize the diagnostic image quality in the region surrounding these devices.

20 Claims, 7 Drawing Sheets

(58) Field of Classification Search
CPC .............. G01R 33/34007; G01R 33/36; G01R 33/3635; G01R 33/3642; G01R 33/48; G01R 33/4818; G01R 33/481; G01R 33/4824; G01R 33/446; G01R 33/4835; G01R 33/4828; G01R 33/54; G01R 33/543; G01R 33/561; G01R 33/563; G01R 33/565; G01R 33/5611; G01R 33/5612; G01R 33/583; G01R 33/5659; G01R 33/56518; G01R 33/56536; G01R 33/56572; G01R 33/5614; G01R 33/5616; G01R 33/56509; G01R 33/341; G01R 33/385; G01R 33/56358
USPC .................................................. 324/300–322
See application file for complete search history.

(56) References Cited

U.S. PATENT DOCUMENTS

| | | |
|---|---|---|
| 2010/0145183 A1 | 6/2010 | Wahlstrand et al. |
| 2010/0237867 A1 | 9/2010 | Slade |
| 2011/0130646 A1* | 6/2011 | Rezzonico ........... A61B 5/0555 600/421 |
| 2011/0260727 A1 | 10/2011 | Punchard et al. |
| 2012/0182014 A1* | 7/2012 | Rivera .................... A61B 5/055 324/318 |
| 2012/0194198 A1* | 8/2012 | Moran ............... G01R 31/3606 324/432 |
| 2013/0141095 A1* | 6/2013 | Nikolenko ........... G01R 33/341 324/309 |

* cited by examiner

A. 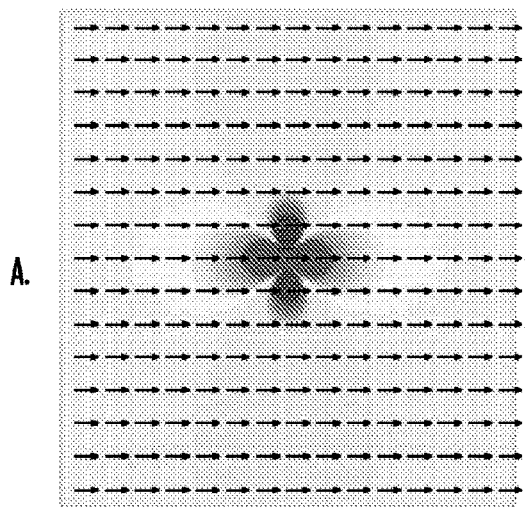 B. 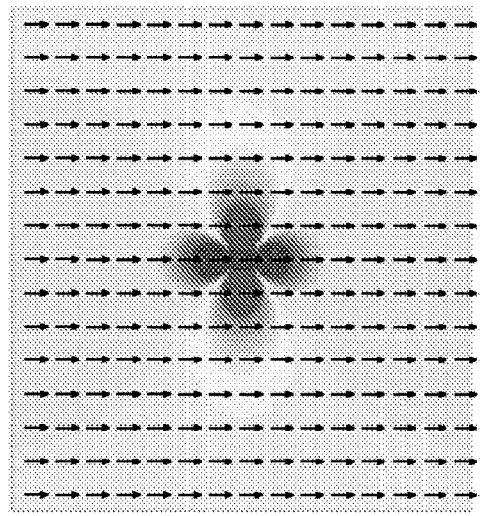
FIG. 2A    FIG. 2B
C. 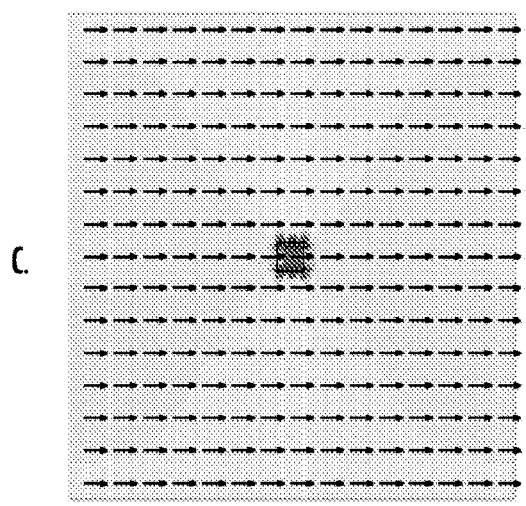 D. 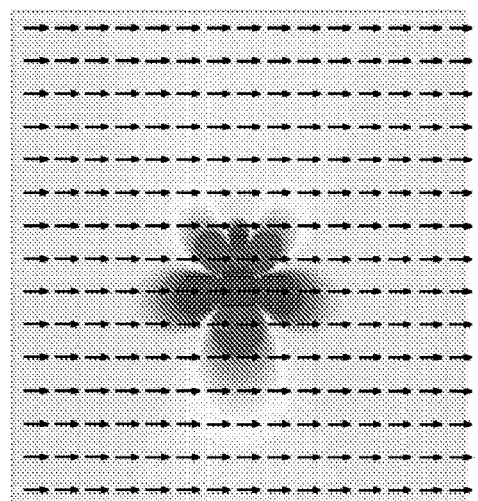
FIG. 2C    FIG. 2D

A. MAGNITUDE IMAGE

B. B0 DISTORTION IMAGE

B. B0 DISTORTION PLOT (IN TESLA)

A. MAGNITUDE IMAGE

B. B0 DISTORTION IMAGE

C. B0 DISTORTION PLOT (IN TESLA)

DEVICE FOR CANCELLATION OF LARGE MAGNETIC SUSCEPTIBILITY ARTIFACTS IN MAGNETIC RESONANCE IMAGING OF PATIENTS WITH PACEMAKERS AND IMPLANTABLE CARDIAC DEFIBRILLATORS

CROSS-REFERENCE TO RELATED APPLICATIONS

This application is a 35 U.S.C. § 371 U.S. national entry of International Application PCT/US2014/039068, having an international filing date of May 22, 2014, which claims the benefit of U.S. Provisional Application No. 61/826,194, filed May 22, 2013, the content of each of the aforementioned applications is herein incorporated by reference in their entirety.

GOVERNMENT SUPPORT

This invention was made with government support under R01HL094610 and K23HL107787-01, both awarded by the National Institute of Health. The government has certain rights in the invention.

FIELD OF THE INVENTION

The present invention relates generally to magnetic resonance imaging. More particularly, the present invention relates to a device and method to address artifacts in magnetic resonance images caused by pacemakers and implantable cardiac defibrillators.

BACKGROUND OF THE INVENTION

Magnetic resonance imaging (MRI) is the gold-standard modality for localizing myocardial scar. MRI assessment of myocardial viability prior to revascularization has been well described. The ability to distinguish endocardial, mid-myocardial, and epicardial scar using MRI could also significantly improve the targeting of ventricular arrhythmia ablation, which is challenging using currently available technology and techniques. However, many patients in need of viability assessment and ventricular arrhythmia ablation also have variations in magnetic susceptibility in the chest due to pacemakers and, in particular, implantable cardiac defibrillators (ICDs). High quality MRI images depend on baseline magnetic field (B0) uniformity. The previously mentioned objects close to the imaging field of view significantly distort B0 leading to significant image distortion and signal loss. This image artifact commonly obscures the left ventricular anterior, septal, and lateral walls, which are important targets for revascularization and ventricular tachycardia ablation, as illustrated in FIG. 1.

Shimming is a process of optimizing the homogenicity of the magnetic field and is a standard technique for reducing the distortion and improving the resolution of MRI images. Current shimming techniques, however, are targeted at minimizing small field distortions caused by lesser susceptibility variations, such as when imaging the brain region surrounding the nasal air cavities. Devices such as pacemakers and in particular ICDs introduce a larger susceptibility variation into the magnetic field and consequently a more extensive imaging artifact.

It would therefore be advantageous to provide a device and method for a shimming technique in order to cancel large susceptibility artifacts.

SUMMARY OF THE INVENTION

The foregoing needs are met, to a great extent, by the present invention, wherein in one aspect a system for cancelling an artifact in magnetic resonance imaging includes a solenoid electromagnet having a coil and said solenoid electromagnet is configured to be positioned adjacent to a source of the artifact and a computing device configured to determine adjustments to the solenoid electromagnet to reduce the artifact.

In accordance with an aspect of the present invention, the coil can take the form of multiple coils. The coils are uniformly wound. The system can also include a magnetic resonance imaging device, and the solenoid electromagnet is positioned in a gantry of the magnetic resonance imaging device. Additionally, the computing system is configured to determine adjustments based on position, current, and rotation.

In accordance with another aspect of the present invention, the system further includes a motorized platform wherein the solenoid is positioned on a surface of the motorized platform. The non-transitory computer readable medium being programmed to translate the position of the solenoid using the motorized platform. The non-transitory computer readable medium is programmed to increment or decrement translational position of the solenoid with respect to an original position. The non-transitory computer readable medium is programmed to measure B0 field distortion within a user selected region of interest, calculate a percent artifact within the region of interest, determine a percentage artifact when both increment and decrement of translational position from the solenoid results in a greater percentage of artifact.

In accordance with another aspect of the present invention, the motorized platform is configured to rotate an orientation of the solenoid. The non-transitory computer readable medium is programmed to increment or decrement rotational position of the solenoid with respect to an original position of the solenoid. The non-transitory computer readable medium is programmed to measure B0 field distortion within a user selected region of interest, calculate a percent artifact within the region of interest, determine a percentage artifact when both increment and decrement of rotational position from the solenoid results in a greater percentage of artifact. The solenoid includes a series of linearly arranged coils. The linearly arranged coils are activated to produce linear translation of an electromagnetic field produced by the solenoid. The non-transitory computer readable medium is programmed to increment and decrement current to different coils to achieve a minimum percent artifact.

In accordance with yet another aspect of the present invention, the solenoid can also include a series of orthogonal coils. The orthogonal coils are activated to produce rotation of an electromagnetic field produced by the solenoid. The non-transitory computer readable medium is programmed to increment and decrement current to different coils to achieve a minimum percent artifact. The solenoid can also take the form of a series of linear coils and a series of orthogonal coils.

BRIEF DESCRIPTION OF THE DRAWINGS

The accompanying drawings provide visual representations, which will be used to more fully describe the representative embodiments disclosed herein and can be used by those skilled in the art to better understand them and their inherent advantages. In these drawings, like reference numerals identify corresponding elements and:

FIGS. 2A-2D illustrate field distortion associated with magnetic resonance imaging.

DETAILED DESCRIPTION

Figure 1:
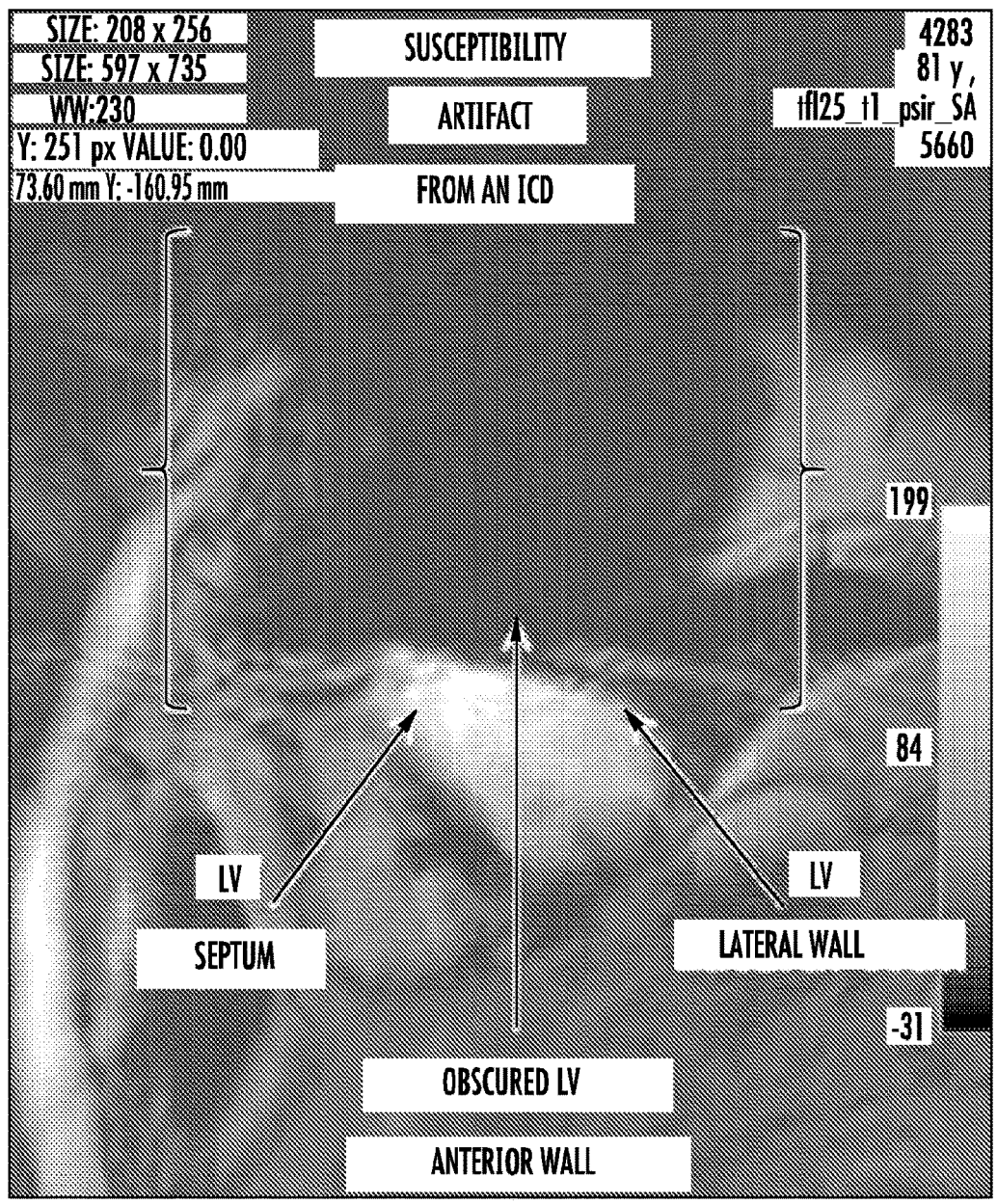
FIG. 1 illustrates an exemplary image affected by artifact.

The presently disclosed subject matter now will be described more fully hereinafter with reference to the accompanying Drawings, in which some, but not all embodiments of the inventions are shown. Like numbers refer to like elements throughout. The presently disclosed subject matter may be embodied in many different forms and should not be construed as limited to the embodiments set forth herein; rather, these embodiments are provided so that this disclosure will satisfy applicable legal requirements. Indeed, many modifications and other embodiments of the presently disclosed subject matter set forth herein will come to mind to one skilled in the art to which the presently disclosed subject matter pertains having the benefit of the teachings presented in the foregoing descriptions and the associated Drawings. Therefore, it is to be understood that the presently disclosed subject matter is not to be limited to the specific embodiments disclosed and that modifications and other embodiments are intended to be included within the scope of the appended claims.

The present invention is directed to a system and method for reducing large magnetic artifact susceptibility in magnetic resonance imaging. The present invention is used to maximize cancellation of the magnetic field distortion created when objects with high variations in magnetic susceptibility are placed in a uniform magnetic field. Particularly, the present invention reduces the magnetic resonance imaging artifact produced by pacemakers and internal cardiac defibrillators in order to maximize the diagnostic image quality in the region surrounding these devices.

With respect to the problem solved by the present invention, a focal susceptibility variation placed in a magnetic field produces a magnetic dipole shaped magnetic field distortion, as illustrated in FIG. 2A. In this and subsequent figures, the grey background reflects the baseline magnetic field, such as that produced by the MRI scanner. The arrows show the baseline magnetic field direction from left to right and the dark grey tint represents a reduction in field intensity, and the medium grey tint represents an increase in field intensity. The general principle of the proposed device is to produce a controlled field distortion that opposes the field distortion created by the susceptibility variation, illustrated in FIG. 2B, such that the superposition of the two field distortions can reduce the net field distortion, as illustrated in FIG. 2C.

If the dipole field distortion can be surrounded by a controlled distortion of the opposite polarity, the net field distortion can be significantly reduced in all directions, as illustrated in FIG. 2C. However, if the controlled distortion is displaced to one side of the susceptibility variation, as in the case of the proposed device being placed over a subcutaneous implant, such complete field cancellation is not possible, as illustrated in FIG. 2D. Never the less, as described further below, the controlled field distortion intensity and position can be adjusted to minimize the field distortion in a region of interest for a given set of intensity and positioning constraints.

In practice the controlled field distortion can be created by a solenoid electromagnet that is placed as close as possible to the susceptibility variation, whose field intensity and polarity can be controlled by a current source connected in series with the solenoid, and whose location can be translated and rotated. The device field intensity, translation, and rotation can be controlled either manually or automatically to minimize the net magnetic field distortion in the region of interest as illustrated in FIGS. 3A-3D and 4A-4D.

Figures 3A, 3B:
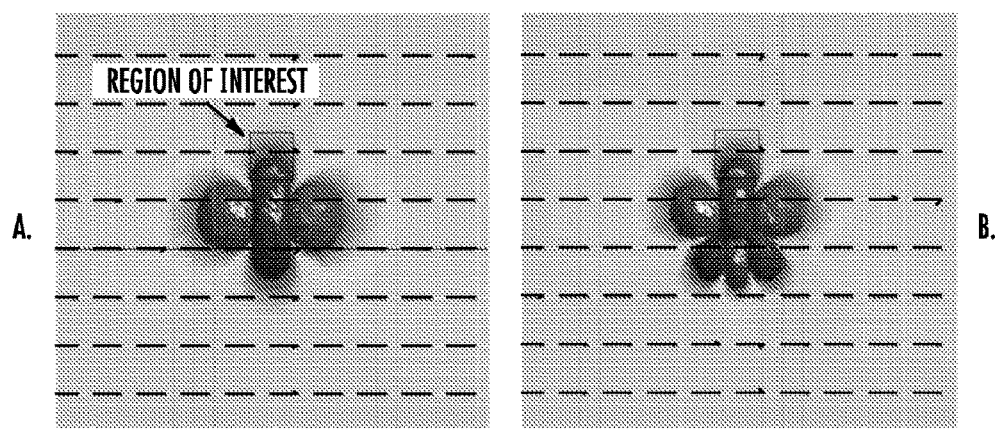
FIGS. 3A-3E illustrate how the intensity of the controlled distortion can be adjusted to produce the minimum field distortion in the region of interest, demarcated by the black box, according to an embodiment of the present invention.
Figures 3C, 3D:
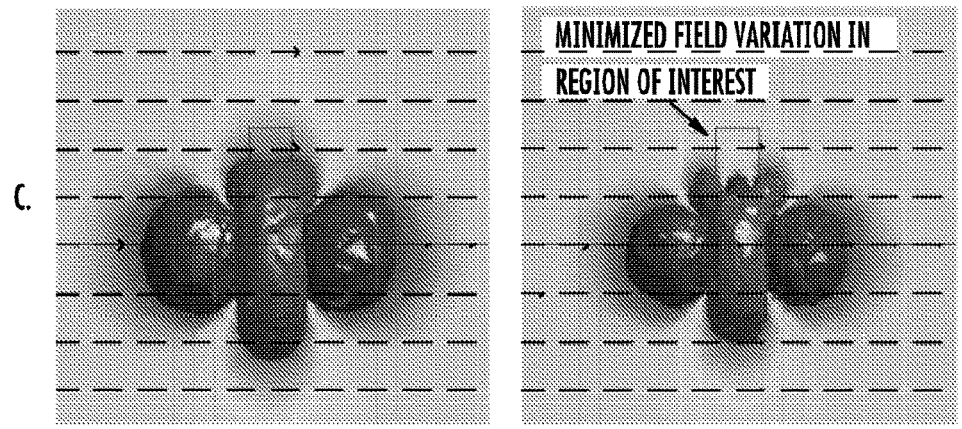

FIGS. 3A-3E illustrate how the intensity of the controlled distortion can be adjusted to produce the minimum field distortion in the region of interest, demarcated by the black box. FIG. 3A shows results of a computational simulation of the 3D field distortion created by a susceptibility variation that overlaps a region of interest demarcated by the black square. In FIGS. 3B-3D a controlled field distortion is introduced, modeled by a cylinder carrying a circumferential electric current. In FIG. 3B, the controlled field distortion intensity is too low, and in FIG. 3C the controlled distortion intensity is too high. FIG. 3D illustrates that the controlled distortion intensity is optimized to produce the minimum net field distortion in the region of interest.

Figures 4A, 4B:
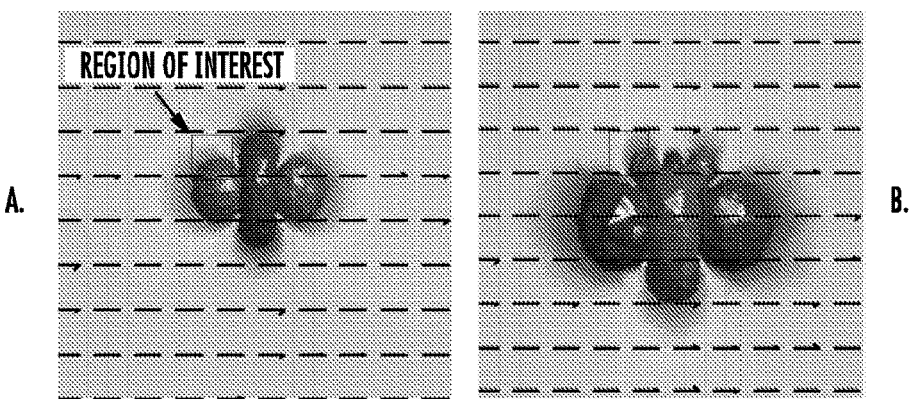
FIGS. 4A-4E illustrate how the displacement of the controlled distortion can be adjusted along the axis of the dipole distortion created by the susceptibility variation to minimize the distortion in different parts of the dipole distortion, according to an embodiment of the present invention.
Figures 4C, 4D:
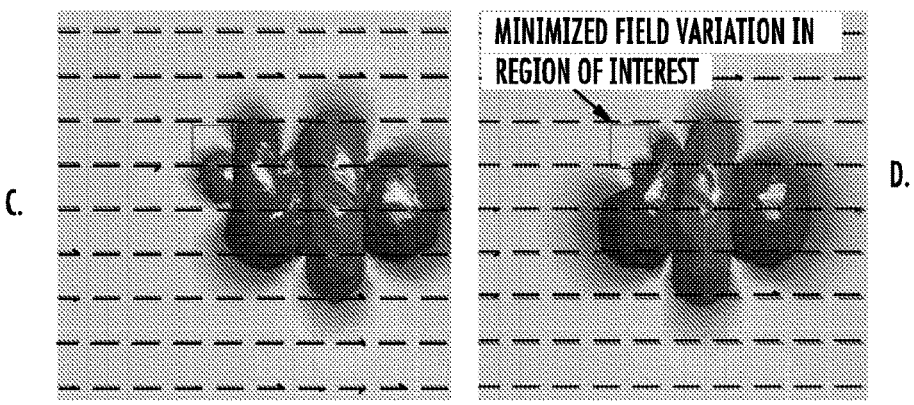

FIGS. 4A-4E illustrate how the displacement of the controlled distortion can be adjusted along the axis of the dipole distortion created by the susceptibility variation to minimize the distortion in different parts of the dipole distortion. In this case, the region of interest is to the left of the susceptibility variation. FIG. 4A illustrates the baseline field distortion overlapping the region of interest demarcated by the black square. Too little displacement of the controlled field distortion, as illustrated in FIG. 3B, or too much displacement as illustrated in FIG. 4C, produces more field distortion in the region of interest than the optimal displacement, FIG. 4D.

Though the discussed implementation of the device is with an electromagnet because of the ability to cancel the field distortion created by larger susceptibility variations, in principle a diamagnetic object could be used in a similar manner to minimize the field distortion created by a paramagnetic field distortion.

A preferred implementation of this concept utilizes a multi-layer solenoid coil constructed from wire that is capable of safely carrying the current needed to generate a magnetic field of sufficient intensity to minimize the field distortion created by the targeted susceptibility variation.

Figures 5A, 5B:
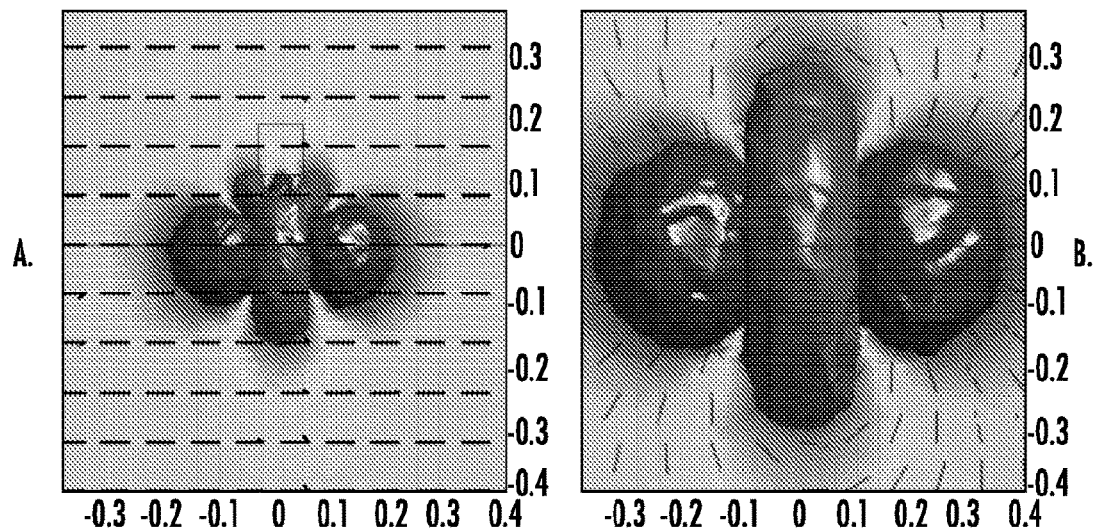
FIGS. 5A-5C illustrate field distortion in relation to magnetic resonance imaging, according to an embodiment of the present invention.
Figure 5C:
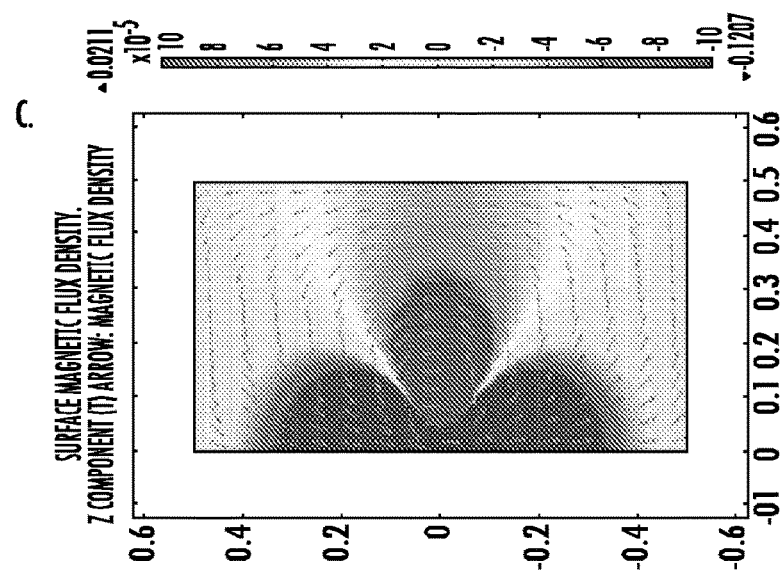

For estimating coil design parameters, 3D electromagnetic finite element analysis was used to determine the amount of field strength needed to cancel the field distortion created by and ICD using parameters. These parameters were estimated from experience performing MRI imaging in patients with ICDs. Using a 1 cm spacing between the proposed device and the ICD, representing the subcutaneous spacing, a 6 cm spacing between the ICD and the heart, a cardiac region of interest of 8 cm^3, a field distortion of 0.0001T representing the margin of the ICD artifact, and a typical artifact encroaching on 30% of the cardiac volume, it was estimated that the required controlled field distortion needs to be approximately 0.0001T at 30 cm from the device. This is illustrated in FIGS. 5A-5C, where FIG. 5A shows the minimized field distortion in the region of interest. FIG. 5B shows the field created by the controlled field distortion with the ICD removed and B0 field switched off to assess the field characteristics of the controlled field itself. The edge of the plotted 3D field surface, representing the 0.0001T boundary has an outer extent of around 30 cm. A multilayer solenoid coil was then modeled using 2D electromagnetic finite element axisymmetric analysis. A 2 cm inner diameter, 1600 turn coil composed of 40 layers of 40 turns of 1 mm diameter wire, provides the specified 0.0001T field distortion at 30 cm with around 5 amps of current, as illustrated in FIG. 5C. 5 amps of current are within the 15 amp chassis wiring current capacity of the 1 mm diameter wire. Additional cooling, for example with flowing water or air, or larger diameter wiring could be used if heating becomes an issue with prolonged device use.

Figure 3E:
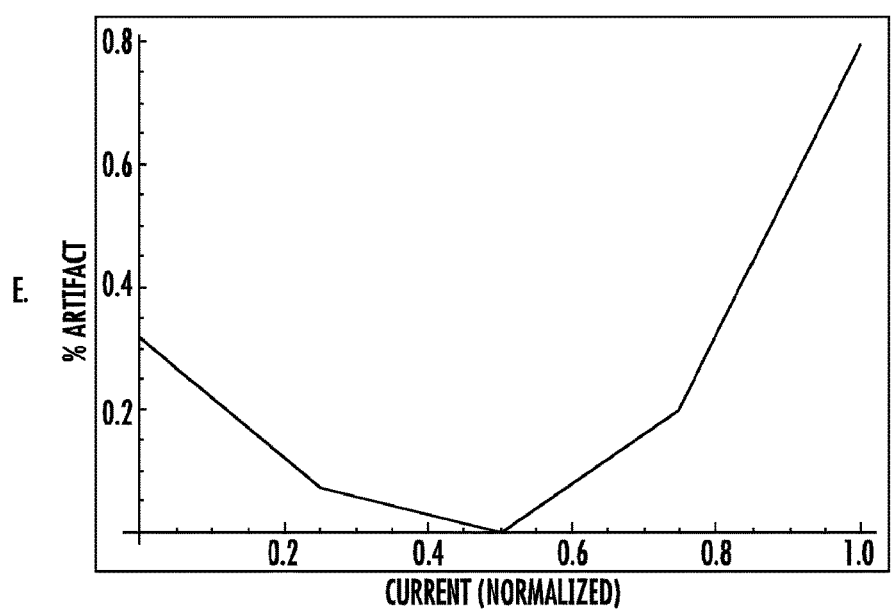
Figure 4E:
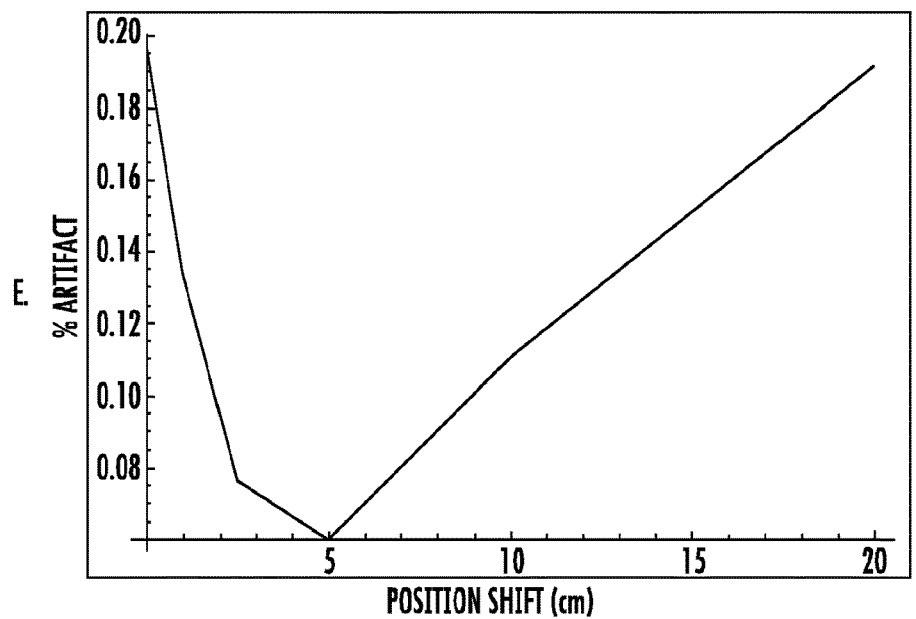
Figure 6A:
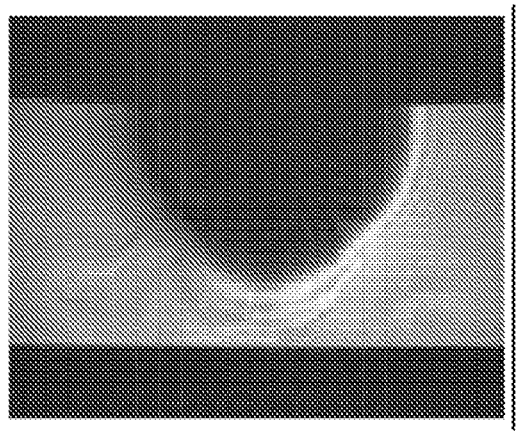
FIGS. 6A-6C illustrate how B0 mapping can be used to quantify the field distortion created by an ICD, according to an embodiment of the present invention.
Figure 6B:
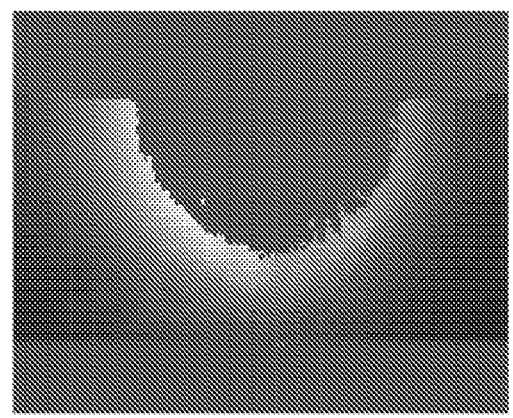
Figure 6C:
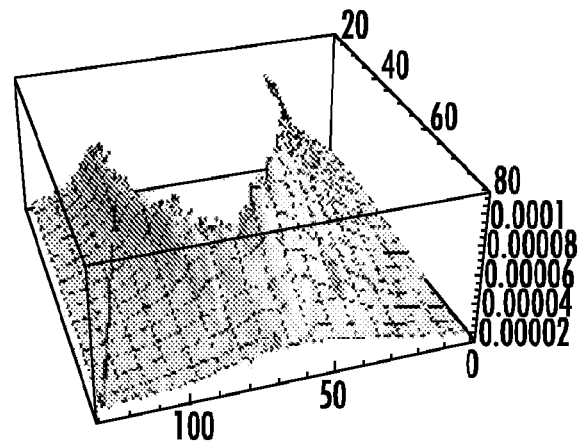
Figure 7A:
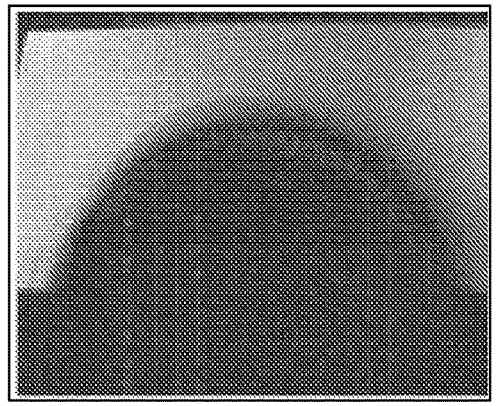
FIGS. 7A-7C show the analogous axial field distortion produced by a prototype multilayer solenoid coil, according to an embodiment of the present invention.
Figure 7B:
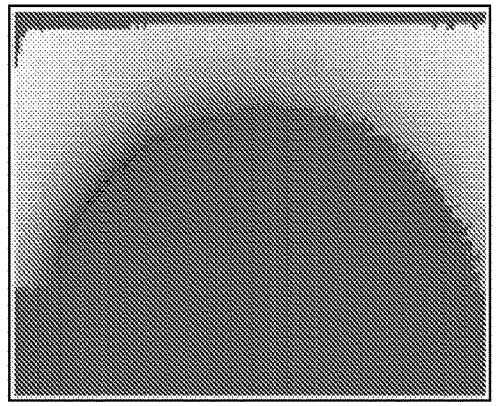
Figure 7C:
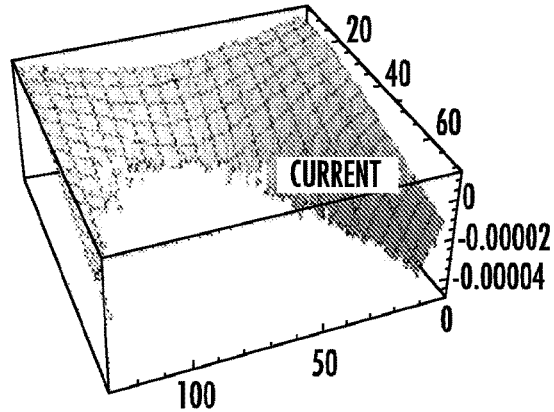

Automatic optimization of the device field intensity and position is possible by measuring the field distortion in the region of interest by standard MRI B0 mapping techniques, as illustrated in FIGS. 6C and 7C. The device current and position parameters can then be systematically varied until the field distortion in the region of interest is minimized, as illustrated in FIGS. 3E and 4E).

FIGS. 6A-6C illustrate how B0 mapping can be used to quantify the field distortion created by an ICD. FIG. 6A shows a typical gradient recalled echo (GRE) MRI axial image of a water tank with an ICD placed on top. Note the dark region representing the artifact induced by the ICD induced susceptibility variation. By performing GRE imaging with two different stimulation to signal reception times, termed echo time, a phase difference image can be calculated, as shown in FIG. 6B. This can be translated into quantitation of the regional magnetic field, FIG. 6C, because of the linear relationship between the phase difference and the local magnetic field. This data was used to estimate the 0.0001T field distortion boundary of the susceptibility artifact that was used in the modeling studies above.

Figure 7D:
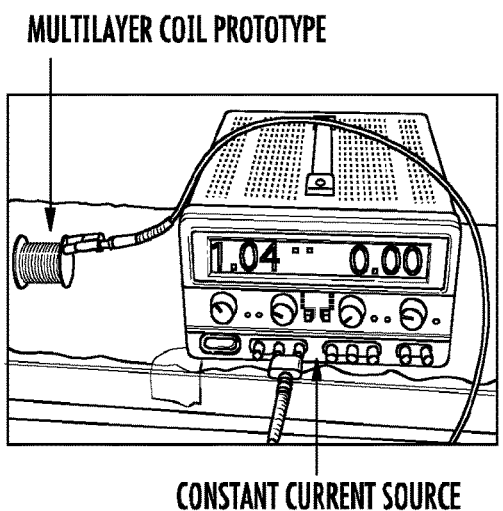
FIG. 7D illustrates an exemplary multilayer solenoid coil, according to an embodiment of the present invention.

FIGS. 7A-7C show the analogous axial field distortion produced by a prototype multilayer solenoid coil. FIG. 7A illustrates a magnitude image and FIG. 7B illustrates a B0 distortion image. FIG. 7C illustrates a B0 distortion plot in Tesla. Note in FIG. 7C, the distortion created by the coil has the opposite magnitude as the distortion created by the ICD and would tend to cancel the ICD induced distortion if the coil were placed adjacent to the ICD. A figure of the prototype coil and current supply is illustrated in FIG. 7D.

In practice, the coil can be mounted in a fixture to prevent movement due to rotational torque exerted by its magnetic field opposing the MRI scanner magnetic field. This fixture could incorporate MRI compatible linear and rotational motors that could be driven by software control for device positioning during automated field cancellation optimization.

Though the device described above consists of a single coil whose orientation and location is adjusted mechanically, in principle the coil position, orientation, and field shape could be optimized with the use of multiple coils. For example, to perform linear translation, a series of coils could be placed along the same axis adjacent to one another and different coils activated depending on the spatial shift desired. For another example, orthogonal coils could be used to orient the net dipole field instead of mechanical rotation of the coil.

For example, a device constructed with a programmable current source could be set to an initial current output by a software program written on a non-transitory computer readable medium. B0 field mapping images could then be acquired as described above and these images could be provided to the software program where the user could interactively select the region of interest (ROI). The mapping images and user selected ROI could then be used to determine the % of the ROI with a B0 field change greater than the artifact generating threshold (% Artifact) generating a point as in FIG. 3E. The software would then increment the output of the current source, B0 field mapping repeated, and % artifact recalculated to determine the % Artifact for that current level. This process would be repeated until the % Artifact within the user selected ROI no longer decreases. If the % Artifact increases after a current increment, the current could be decremented and B0 field mapping repeated until the % Artifact within the user selected ROI no longer decreases. Once the software determines that the % Artifact increases with either increment or decrement of device current the minimum artifact for that device position and orientation has been determined. This corresponds to the minimum % Artifact point on FIG. 3E.

By mounting the device on a programmable motorized platform that can translate the device position, position can adjusted by software control. In a manner analogous to incrementing or decrementing current as described above, position can be incremented or decremented, the B0 field distortion measured within the user selected ROI, the % Artifact within the ROI calculated, and the minimum % Artifact determined when both increment or decrement of position from the present device position results in a greater % Artifact. This corresponds to the minimum % Artifact point on FIG. 4E.

By mounting the device on a programmable motorized platform that can rotate the device orientation, orientation can also be adjusted by software control. In a manner analogous to incrementing or decrementing current and position as described above, rotation can be incremented or decremented, the B0 field distortion measured within the user selected ROI, the % Artifact within the ROI calculated, and the minimum % Artifact determined when both increment or decrement of rotation from the present device rotation results in a greater % Artifact.

The process of sequentially adjusting the device current, then position, then rotation to determine minimum % Artifact could then be repeated to refine the minimum % Artifact estimate until further reductions of % Artifact fall below some threshold level or a maximum number of repetitions has been reached at which point that set device current, position, and rotation is taken to be the settings for generating the minimum device artifact.

Though the device described above consists of a single coil whose orientation and location is adjusted mechanically, in principle the coil position, orientation, and field shape could be optimized with the use of multiple coils. For example, to perform linear translation, a series of coils could be placed along the same axis adjacent to one another and different coils activated depending on the spatial shift desired. For another example, orthogonal coils could be used to orient the net dipole field instead of mechanical rotation of the coil. In this case the software control would increment and decrement the current to different coils to perform the systematic changes of "position" and "rotation" described above to achieve a minimum % Artifact.

It should be noted that any software associated with the present invention is programmed onto a non-transitory computer readable medium that can be read and executed by any computing device known to or conceivable by one of skill in the art, such as a personal computer, imaging computing station, tablet, smartphone, phablet, server, etc. The non-transitory computer readable medium can take any suitable form known to one of skill in the art. The non-transitory computer readable medium is understood to be any article of manufacture readable by a computer. Such non-transitory computer readable media includes, but is not limited to, magnetic media, such as floppy disk, flexible disk, hard, disk, reel-to-reel tape, cartridge tape, cassette tapes or cards, optical media such as CD-ROM, DVD, blu-ray, writable compact discs, magneto-optical media in disc, tape, or card form, and paper media such as punch cards or paper tape. Alternately, the program for executing the method and algorithms of the present invention can reside on a remote server or other networked device. Any databases associated with the present invention can be housed on a central computing device, server(s), in cloud storage, or any other suitable means known to or conceivable by one of skill in the art. All of the information associated with the application is transmitted either wired or wirelessly over a network, via the internet, cellular telephone network, or any other suitable data transmission means known to or conceivable by one of skill in the art.

The many features and advantages of the invention are apparent from the detailed specification, and thus, it is intended by the appended claims to cover all such features and advantages of the invention which fall within the true spirit and scope of the invention. Further, since numerous modifications and variations will readily occur to those skilled in the art, it is not desired to limit the invention to the exact construction and operation illustrated and described, and accordingly, all suitable modifications and equivalents may be resorted to, falling within the scope of the invention.

What is claimed is:

1. A system for cancelling an artifact in magnetic resonance imaging, comprising:
    a solenoid electromagnet having a coil,
        the solenoid electromagnet configured to generate a magnetic field to create a controlled field distortion,
        the solenoid electromagnet being positioned adjacent to a source of the artifact, and
        the solenoid electromagnet being secured to a fixture and configured to restrict movement associated with rotational torque exerted by the magnetic field associated with the solenoid electromagnet opposing a magnetic field associated with a magnetic resonance imaging scanner,
            the fixture being associated with one or more motors associated with movement of the solenoid electromagnet;
    one or more memories; and
    one or more processors, communicatively coupled to the one or more memories, to:
        determine adjustments to the solenoid electromagnet to reduce the artifact based on movement of the solenoid electromagnet.

2. The system of claim 1, wherein the coil includes multiple coils,
    the multiple coils being uniformly wound.

3. The system of claim 1, wherein the solenoid electromagnet is positioned in a gantry of the magnetic resonance imaging scanner.

4. The system of claim 1, wherein the one or more processors, when determining the adjustments, are further to:
    determine the adjustments based on a change of at least one of:
        a translational position associated with the solenoid electromagnet,
        current associated with the solenoid electromagnet, or
        a rotational position associated with the solenoid electromagnet.

5. The system of claim 1, wherein the one or more processors are further to:
    translate a translational position of the solenoid electromagnet using the one or more motors.

6. The system of claim 5, wherein the one or more processors are to:
    to increment or decrement the translational position of the solenoid electromagnet with respect to an original position of the solenoid electromagnet.

7. The system of claim 6, wherein the one or more processors are to:
    measure BO field distortion within a user selected region of interest;
    calculate a percent artifact within the region of interest; and
    determine a percentage artifact when both increment and decrement of the translational position from the solenoid results in a greater percentage of artifact.

8. The system of claim 1, wherein the one or more motors are configured to rotate an orientation of the solenoid electromagnet.

9. The system of claim 8, wherein the one or more processors are further to:
    increment or decrement a rotational position of the solenoid electromagnet with respect to an original position of the solenoid electromagnet.

10. The system of claim 9, wherein the one or more processors are further to:
    measure BO field distortion within a user selected region of interest;
    calculate a percent artifact within the region of interest; and
    determine a percentage artifact when both increment and decrement of the rotational position from the solenoid electromagnet results in a greater percentage of artifact.

11. The system of claim 1, wherein the solenoid electromagnet comprises a series of linearly arranged coils,
    the series of linearly arranged coils being activated to produce linear translation of an electromagnetic field produced by the solenoid electromagnet.

12. The system of claim 11, wherein the one or more processors are further to:
    increment and decrement current to different coils of the series of linearly arranged coils to achieve a minimum percent artifact.

13. The system of claim 1, wherein the solenoid electromagnet comprises a series of orthogonal coils,
    the series of orthogonal coils being activated to produce rotation of an electromagnetic field produced by the solenoid electromagnet.

14. The system of claim 13, wherein the one or more processors are further to:

increment and decrement current to different coils of the series of orthogonal coils to achieve a minimum percent artifact.

15. A system for cancelling an artifact in magnetic resonance imaging, comprising:
    a solenoid electromagnet having a coil,
        the solenoid electromagnet being positioned adjacent to a source of the artifact;
    a motorized platform to move the solenoid electromagnet into a plurality of positions;
    one or more memories; and
    one or more processors, communicatively coupled to the one or more memories, to:
        measure B0 field distortion within a user selected region of interest;
        calculate a percentage artifact within the region of interest;
        determine a minimum percentage artifact when both increment and decrement of at least one of a translational position of the solenoid electromagnet, a rotational position of the solenoid electromagnet, or current associated with the solenoid electromagnet results in a greater percentage of artifact; and
        determine a position and orientation of the solenoid electromagnet based upon the minimum percentage artifact.

16. The system of claim 15, wherein the solenoid electromagnet is secured to a fixture and configured to restrict movement associated with rotational torque exerted by a magnetic field associated with the solenoid electromagnet opposing a magnetic field associated with a magnetic resonance imaging scanner.

17. The system of claim 15, wherein the coil includes multiple coils,
    the multiple coils being uniformly wound.

18. A system for cancelling an artifact in magnetic resonance imaging, comprising:
    a solenoid electromagnet having a coil,
        the solenoid electromagnet configured to generate a magnetic field to create a controlled field distortion,
        the solenoid electromagnet being positioned adjacent to a source of the artifact, and
        the solenoid electromagnet being secured to a fixture with a motorized platform and configured to restrict movement associated with rotational torque exerted by the magnetic field associated with the solenoid electromagnet opposing a magnetic field associated with a magnetic resonance imaging scanner;
    one or more memories; and
    one or more processors, communicatively coupled to the one or more memories, to:
        determine adjustments to the solenoid electromagnet to reduce the artifact based on movement of the solenoid electromagnet.

19. The system of claim 18, wherein the one or more processors are further to:
    measure B0 field distortion within a user selected region of interest;
    calculate a percentage artifact within the region of interest;
    determine a minimum percentage artifact when both increment and decrement of at least one of a translational position of the solenoid electromagnet, a rotational position of the solenoid electromagnet, or current associated with the solenoid electromagnet results in a greater percentage of artifact; and
    determine a position and orientation of the solenoid electromagnet based upon the minimum percentage artifact.

20. The system of claim 19, wherein the one or more processors are further to:
    determine adjustments to the solenoid electromagnet based on a change of at least one of:
        the translational position of the solenoid electromagnet,
        current associated with the solenoid electromagnet, or
        the rotational position of the solenoid electromagnet.

* * * * *